United States Patent [19]

Bonora et al.

[11] Patent Number: 4,802,809

[45] Date of Patent: Feb. 7, 1989

[54] MANIPULATOR FOR STANDARD MECHANICAL INTERFACE APPARATUS

[75] Inventors: Anthony C. Bonora, Menlo Park; Andrew W. O'Sullivan, Gilroy, both of Calif.

[73] Assignee: Asyst Technologies, Milpitas, Calif.

[21] Appl. No.: 49,393

[22] PCT Filed: Aug. 25, 1986

[86] PCT No.: PCT/US86/01758

§ 371 Date: Apr. 20, 1987

§ 102(e) Date: Apr. 20, 1987

[87] PCT Pub. No.: WO87/01361

PCT Pub. Date: Mar. 12, 1987

Related U.S. Application Data

[63] Continuation-in-part of Ser. No. 769,709, Aug. 26, 1985, Pat. No. 4,676,709, which is a continuation-in-part of Ser. No. 769,850, Aug. 26, 1985, Pat. No. 4,674,936.

[51] Int. Cl.[4] .............................................. B65G 65/00
[52] U.S. Cl. ..................... 414/217; 414/608; 414/618; 414/733; 414/742
[58] Field of Search ............... 414/217, 221, 222, 225, 414/226, 287, 331, 589, 592, 608, 618, 733, 742, 787; 901/15, 17, 18

[56] References Cited

U.S. PATENT DOCUMENTS

| 3,262,593 | 7/1966 | Hainer | 901/15 X |
| 4,527,446 | 7/1985 | Borodin | 414/732 X |
| 4,674,936 | 6/1987 | Bonora | 414/742 X |
| 4,674,939 | 6/1987 | Maney et al. | 414/292 |
| 4,676,709 | 6/1987 | Bonora et al. | 414/742 X |

Primary Examiner—Frank E. Werner
Assistant Examiner—David A. Bucci
Attorney, Agent, or Firm—Fliesler, Dubb, Meyer & Lovejoy

[57] ABSTRACT

The present invention provides an apparatus for transferring a cassette holding articles to be processed to and from a container supported at a processing station where the processing station has a cassette port for receiving the cassette when the cassette moves along a central axis extending from outside the processing station through the cassette port, and into the processing station, said apparatus comprising: a platform device including a cassette platform transportable substantially along the central axis for transferring the cassette to and from the container substantially along the central axis; a manipulator device including a first member extending substantially orthogonal to the central axis, the first member including a first portion and a second portion; a pivoting arm including a pivoting portion and a coupling portion, the pivoting portion mounted pivotally adjacent to the second portion of the first member, the pivoting arm operable to pivot about a pivot axis extending substantially through the pivoting portion and substantially perpendicular to the central axis; a coupling device mounted on the coupling portion of the pivoting arm for coupling to the cassette; and a tilt device for tilting the coupling device and the cassette coupled thereto during pivoting by said pivoting arm, such that during the pivoting the cassette tilts relative to the central axis.

37 Claims, 11 Drawing Sheets

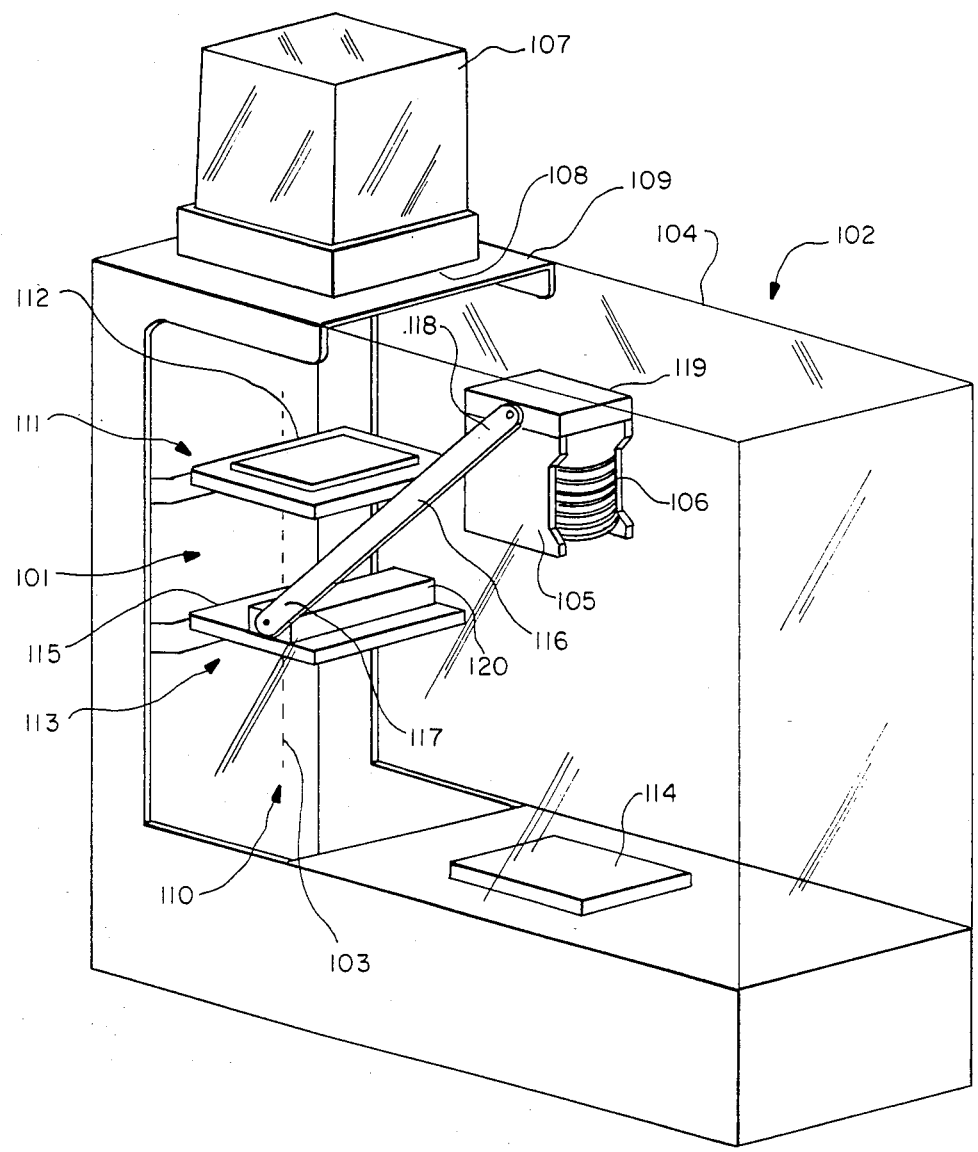
FIG. —9

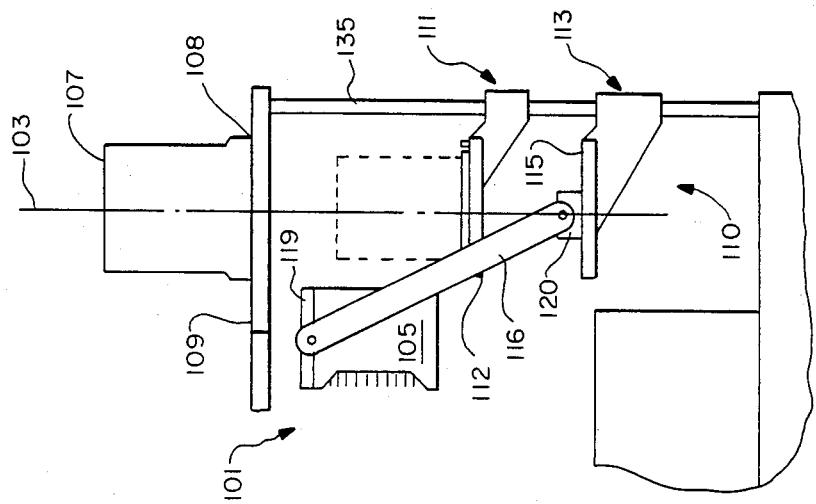
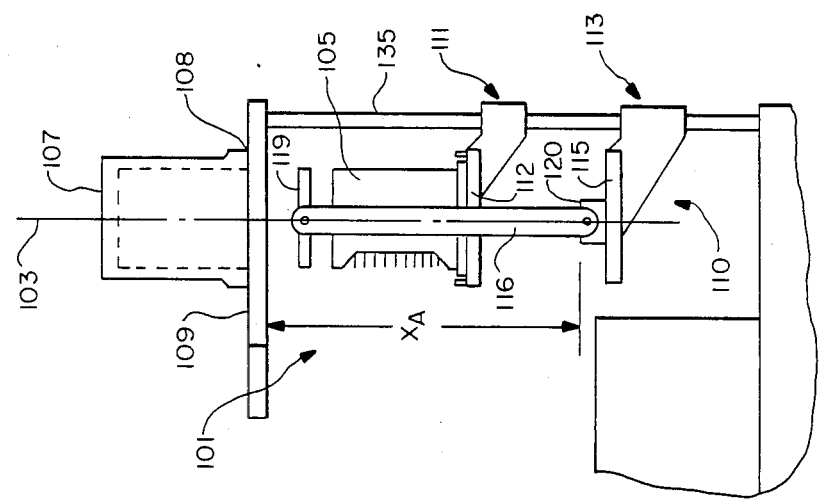
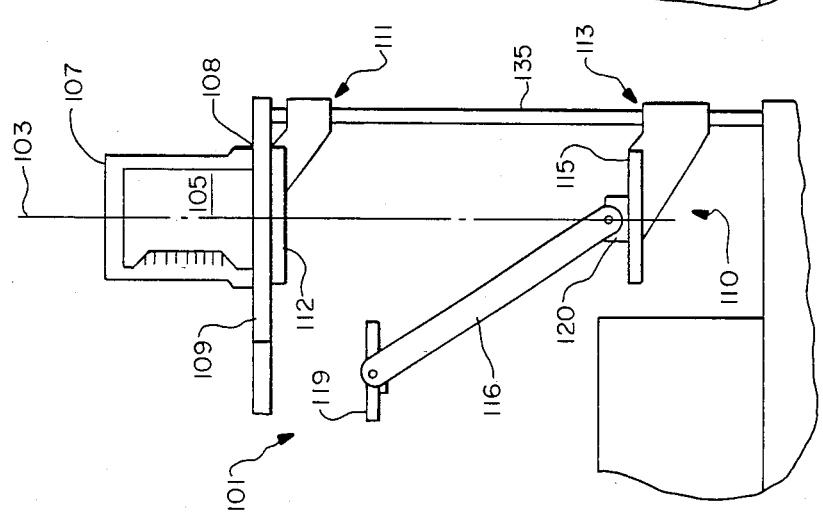

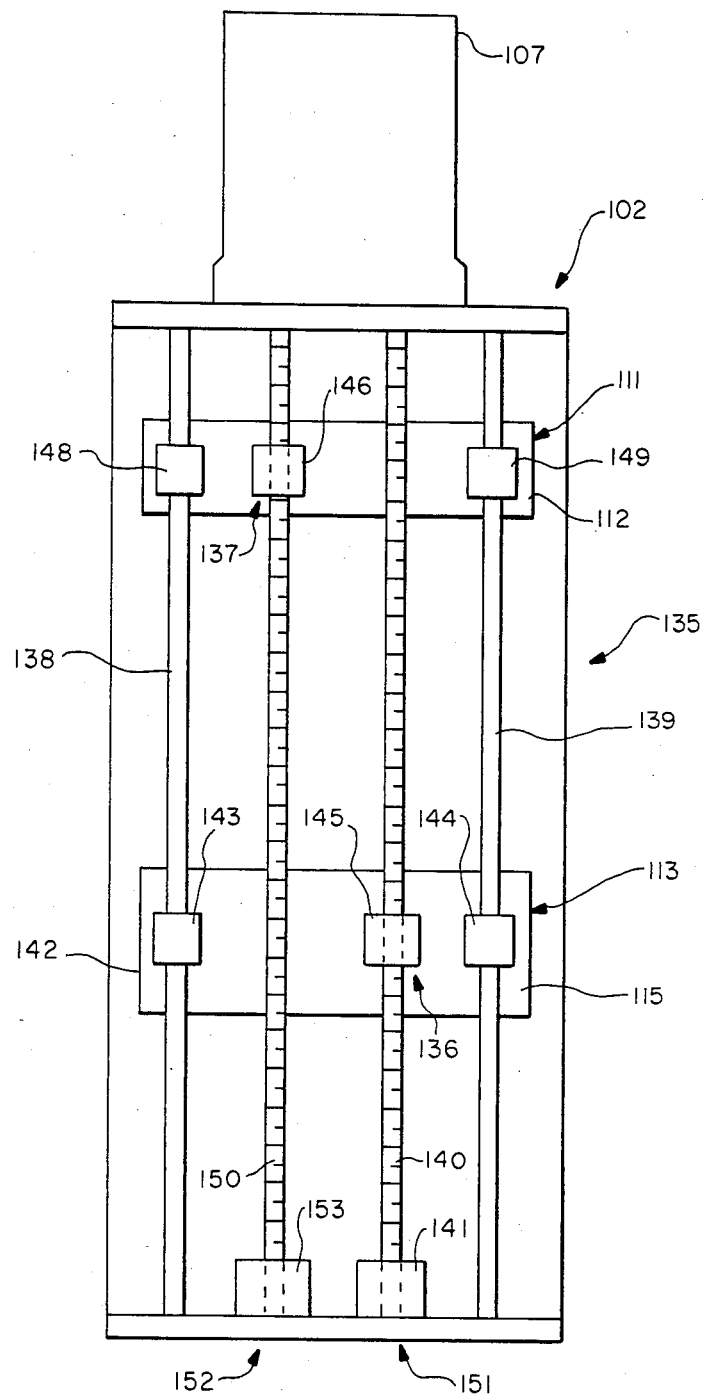
FIG.—15

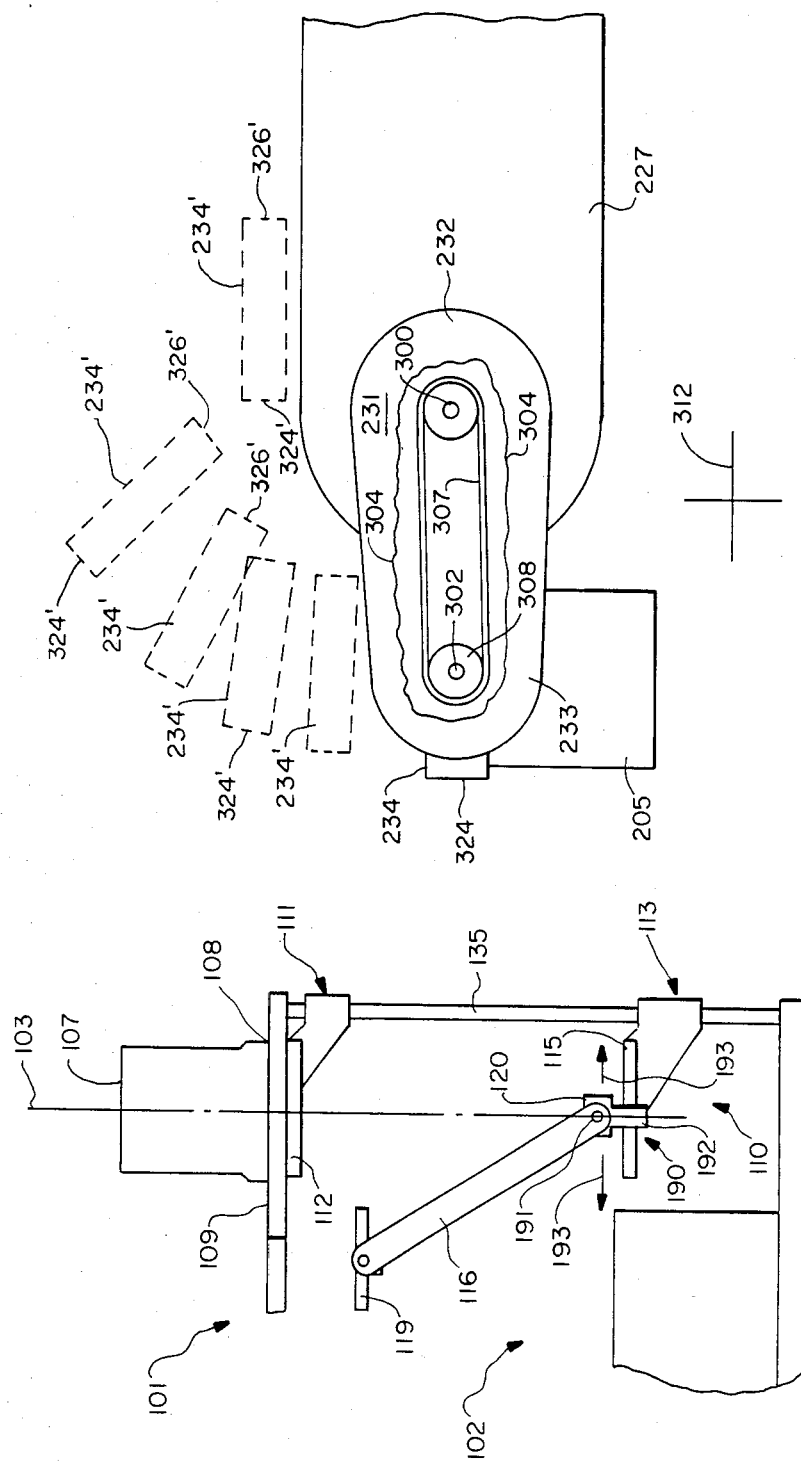

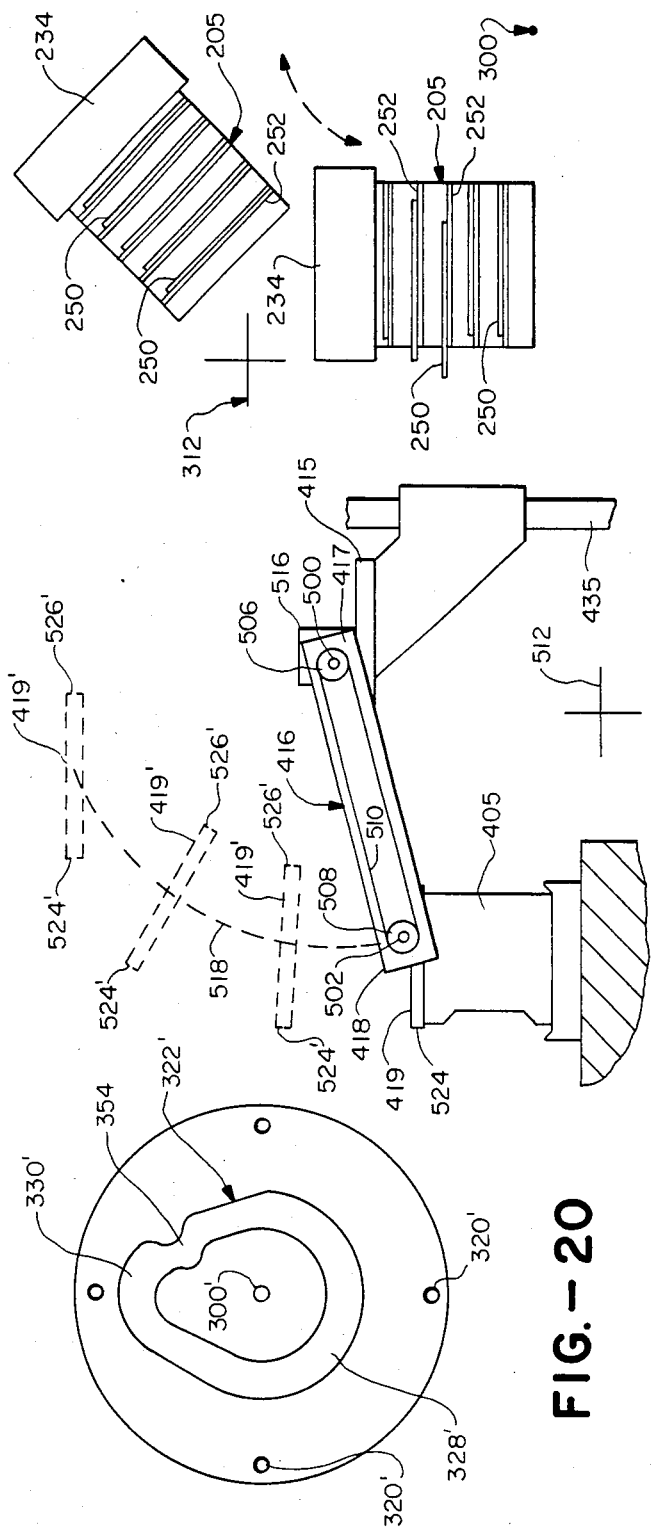

MANIPULATOR FOR STANDARD MECHANICAL INTERFACE APPARATUS

This is a continuation-in-part of formerly copending application Ser. No. 769,709, filed Aug. 26, 1985 and issued June 30, 1987 as U.S. Pat. No. 4,676,709 and formerly copending application Ser. No. 769,850, filed Aug. 26, 1985 and issued June 23, 1987 as U.S. Pat. No. 4,674,936. Each of these patent applications is commonly assigned to assignee herein.

CROSS REFERENCE TO RELATED APPLICATIONS

SEALED STANDARD INTERFACE APPARATUS; Inventors: George Allen Maney, Andrew William O'Sullivan, W. George Faraco; U.S. Pat. No. 4,674,939, issued June 23, 1987 which is commonly assigned to the assignee herein.

BOX DOOR ACTUATED RETAINER; Inventors: George Allen Maney, Andrew William O'Sullivan, W. George Faraco; Ser. No. 686,443; Filed: Dec. 24, 1984 which is commonly assigned to assignee herein.

BACKGROUND OF THE INVENTION

The present invention relates to manipulating apparatus for standardized mechanical interface systems for reducing particle contamination and more particularly to apparatus transferring cassettes containing articles to be processed into and out of sealed containers suitable for use in semiconductor processing equipment to prevent particle contamination.

A standardized mechanical interface (SMIF) apparatus has been proposed to reduce particle contamination by significantly reducing particle fluxes onto wafers. This end is accomplished by mechanically ensuring that during transport, storage and processing of the wafers, the gaseous media (such as air or nitrogen) surrounding the wafers is essentially stationary relative to the wafers and by ensuring that particles from the ambient outside environment do not enter the immediate internal wafer environment.

Control of particulate contamination is imperative for cost effective, high-yielding and profitable manufacturing of VLSI circuits. Because design rules increasingly call for smaller and smaller lines and spaces, it is necessary to exert greater and greater control on the number of particles and to remove particles with smaller and smaller diameters.

Some contamination particles cause process defects, such as incomplete etching in spaces between lines leading to an unwanted electrical bridge. In addition to such physical process defects, other contamination particles may cause electrical failure due to induced ionization or trapping centers in gate dielectrics or junctions.

Modern processing equipment must be concerned with particle sizes which range from below 0.01 micrometers to above 200 micrometers. Particles with these sizes can be very damaging in semiconductor processing. Typical semiconductor processes today employ geometries which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries.

In typical processing environments today, "clean rooms" are established in which, through filtering and other techniques, attempts are made to remove particles having geometries of 0.03 micrometer and above. There is a need, however, to improve the processing environment. The conventional "clean room" cannot be maintained as particle free as desired. It is virtually impossible to maintain conventional clean rooms free of particles of a 0.01 micrometer size and below.

The main sources of particulate contamination are personnel, equipment, and chemicals. Particles given off by personnel are transmitted through the environment and through physical contact or migration onto the wafer surface. People, by shedding of skin flakes, for example, are a significant source of particles that are easily ionized and cause defects. Although clean room garments reduce particle emissions they do not fully contain the emissions. It has been found that as many as 6000 particles per minute are emitted into an adjacent one cubic foot of space by a fully suited operator.

To control contamination particles, the trend in the industry is to build more elaborate and expensive clean rooms with HEPA and ULPA recirculating air systems. Filter efficiencies of 99.999% and up to ten complete air exchanges per minute are required to obtain an acceptable level of cleanliness.

To minimize process defects, processing equipment manufacturers must prevent machine generated particles from reaching the wafers, and suppliers of gases and liquid chemicals must deliver cleaner products. Most important, a system must be designed that will effectively isolate wafers from particles during storage, transport and transfer into processing equipment. The Standard Mechanical Interface (SMIF) system has been proposed to achieve this goal. The SMIF concept is based on the realization that a small volume of still, particle-free air, with no internal source of particles, is the cleanest possible environment for wafers. Further details of one proposed system are described in the article "SMIF: A TECHNOLOGY FOR WAFER CASSETTE TRANSFER IN VLSI MANUFACTURING", by Mihir Parikh and Ulrich Kaempf, *Solid State Technology*, July 1984, pp. 111–115 and in the above cross-referenced applications.

The proposed SMIF system has three main components, namely, (1) minimum volume, dustproof containers are used for storing and transporting wafer cassettes; (2) canopies are placed over cassette ports of processing equipment so that the environments inside the containers and canopies become miniature clean spaces; (3) doors on the containers are designed to mate with doors on the cassette ports on the equipment canopies and the two doors are opened simultaneously so that particles which may have been on the external door surfaces are trapped ("sandwiched") between the doors.

In the proposed SMIF system, a container is placed at the cassette port on top of the canopy; latches release the container door and the canopy port door simultaneously. A mechanical elevator lowers the two doors, with the cassette riding on top, into the canopy covered space. A manipulator picks up the cassette and places it onto the cassette port/elevator or other location within the canopy of the equipment. After processing, the reverse operation takes place.

The SMIF system has been proved effective by experiments using prototype SMIF components both inside and outside a clean room. The SMIF configuration achieved a ten-fold improvement over the conventional handling of open cassettes inside the clean room.

However, due to the restrictive space within the canopy of the processing station, the size and configuration of the elevators and manipulators within the canopy must be restricted. Furthermore it is desirable that the equipment for removing the cassette holding articles to be processed from the standard mechanical interface container and resealing the container be confined to a small space when not in use in order to maximize the freedom of manipulation of the cassette within the limited space under the canopy of the processing station.

SUMMARY OF THE INVENTION

The present invention is a manipulator for transferring a cassette, holding articles to be processed, to and from a container supported at a processing station. The processing station has a cassette port for receiving the cassette when the cassette moves along a central axis extending from outside the processing station, through the cassette port, and into the processing station. A platform for supporting the cassette is transportable along the axis for transferring the cassette to and from the container along the central axis. A manipulator is provided for transferring the cassette to and from the central axis to a location offset from the axis whereby the platform can travel along the axis past the cassette in a bypassing relation.

In a first aspect of the invention, the manipulator includes two arms in an arrangement having a pivot for the first arm located between the central axis and an offset from the axis at the end of the platform. The first pivot arm length together with the location of the pivot point establishes a mechanism which minimizes the height required in order to have the co-axial loading and unloading, in a bypassing relationship, of the cassette from and to the platform.

The first aspect of the present invention minimizes the amount of height required in which to co-axially load and unload a cassette from the container. This feature is particularly useful when the present invention is adapted to SMIF processing apparatus in a clean room environment where the vertical dimension needs to be small.

In a second aspect of the invention, the manipulator includes an arm in an arrangement having a pivot located on and attached to an arm platform. The pivot arm length together with the location of the pivot point on the arm platform establishes a mechanism which maximizes the reach from the central axis while still permitting the co-axial loading and unloading, in a bypassing relationship, of the cassette from and to the cassette platform.

The second aspect of the present invention maximizes the amount of reach of the cassette which can be co-axially loaded and unloaded from the cassette platform. This long-arm feature is particularly useful when the present invention is adapted to SMIF processing apparatus in a clean room environment where the reach dimension needs to be large.

In addition, a tilt mechanism has been provided to further aspects of both the first and second aspects of the invention so as to tilt a cassette during pivoting of the pivoting arm. The tilt mechanism advantageously causes cassettes seated on shelves within the cassette to slide into proper seating position in the cassette.

Additional objects and features of the invention will appear from the following description in which the preferred embodiments of the invention have been set forth in detail in conjunction with the drawings.

BRIEF DESCRIPTION OF THE DRAWINGS

FIG. 9 is a perspective view of the manipulator according to a second present embodiment of the invention with a simplified depiction of a processing station;

FIG. 10 through FIG. 14 are side view drawings of the manipulator according to the second present embodiment of the invention used in description of the manipulation of a cassette holding articles to be processed from a SMIF container into the processing station;

FIG. 15 is a backview of the manipulator according to the second present embodiment of the invention showing a means for transporting the platforms along the shaft;

FIG. 16 is a side view drawing of a first alternative embodiment of the manipulator according to principles of the second present embodiment of the invention having a manipulator arm with a moveable pivot point on a carriage on the second platform;

FIG. 17 is a first partially fragmented elevation view of a pivot arm for use with the first embodiment and illustrating first and second sprocket wheels;

FIG. 20 is a side elevation view of a plate suitable for use with the pivot arm of FIG. 17 including a cam profile having a discontinuity portion; and FIG. 21 is a partially fragmented side elevation view of a mechanical arm for use with the second embodiment and illustrating first and second sprocket wheels.

FIG. 22 is a cross sectional side elevation view of the cassette of FIG. 17 in two stages of tilt about the tilt axis and about the pivot axis and in which wafers are shown resting upon shelves within the cassette.

DETAILED DESCRIPTION

With reference to the Figures, a detailed description of first and second embodiments and related alternative embodiments for the present invention are described.

Figure 1:
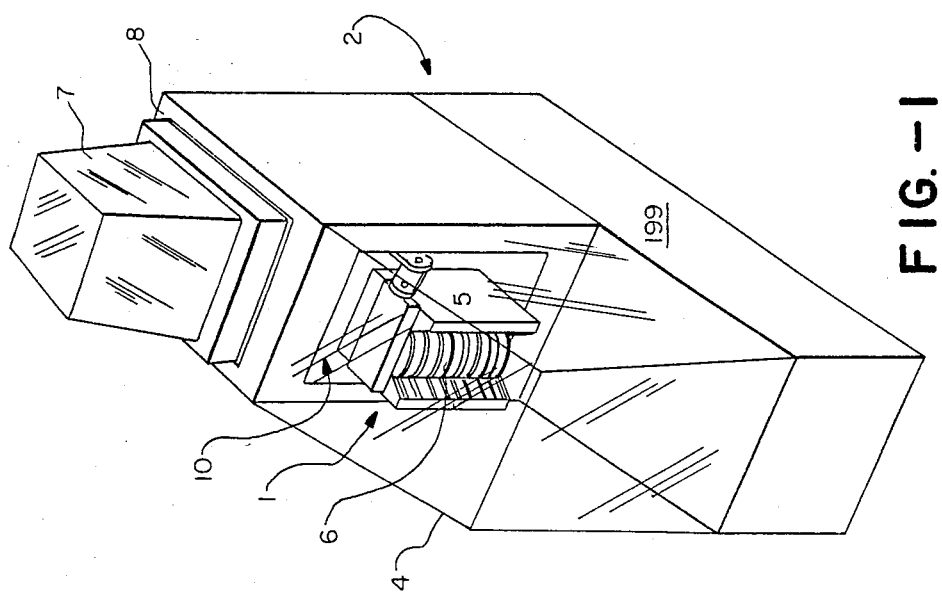
FIG. 1 is a perspective view of the manipulator according to a first present embodiment of the invention with a simplified depiction of a processing station.

FIG. 1 shows a perspective view of manipulator 1 according to a first embodiment of the present invention mounted with a simplified depiction of a processing station 2 with which the manipulator 1 is used. The processing station 2 includes a body 3 in which a processing step is conducted. For instance, when articles to be processed are semiconductor wafers, the processing station 2 may operate to place a layer of photoresist on the surface of the wafer. Of course, many other processing steps may be accomplished.

Processing station 2 includes a canopy 4 which covers open parts of the body 3 of the processing station 2. The canopy 4 prevents particulate contamination inside the processing station 2. The manipulator 1 operates to remove a cassette 5 holding articles 6 to be processed from a container 7 that is supported on the processing station 2. The processing station 2 has a cassette port 8 for receiving the cassette 5 into the processing station 2.

The manipulator 1 comprises a shaft 10 extending from the cassette port 8 into the processing station 2. Preferably, the shaft 10 extends vertically down from the cassette port 8 so that gravity operates to lower the cassette 5 from the container 7 when the cassette port 8 is opened.

The manipulator 1 of the first embodiment is described in detail with reference to FIGS. 2-6. The manipulator 1 includes the first means 20 for supporting the cassette 5 and transporting the cassette 5 along the shaft 10 through the cassette port 8 to and from the processing station 2. The first means includes the first platform 21 that is supported in the shaft 10. The cassette 5 is supportable on the first platform 21 so that when the cassette port 8 is opened, the cassette 5 rests on the first platform 12. In the preferred embodiment, a removable side of a container 5 is released when the cassette port 8 is opened and is supported on the first platform 21. The cassette 5 is supportable on top of the removable side of the container 5. An alignment pin 22 may be mounted on the first platform 21 or the removable of the side of container 5 to support the cassette 5, or other means for holding the cassette 5 on the platform 21 may be used. The first means 20 includes a means 23 for controllably moving the first platform 21 with the cassette 5 supportable thereon through the shaft 10 from adjacent the cassette port 8 to and from positions down to shaft 10. Thus the first platform 21 is movable up the shaft 10 to mate with and seal the cassette port 8. When the cassette port 8 opens, the cassette 5 is supported on the first platform 21. The first platform 21 may then be lowered along the shaft 10 into the processing station with the cassette 5 riding on it as described with reference to FIGS. 3-6.

The manipulator 1 further includes a second means 25 that is transportable through the shaft 10 for transporting the cassette 5 to and from at least one location 26 in at least partial alignment with the shaft 10 and inside the processing station 2 and for transporting the cassette 5 to and from the first means 20 when the first means is away from the cassette port 8. The second means 13 includes an orthogonal arm 27 or other support extending across and along a side of the shaft 10 so that the first means 20 can pass the orthogonal arm 27 in the shaft. An orthogonal arm is supported on its first end 28 by a means 29 for controllably positioning the orthogonal arm 27 within the shaft 10. The orthogonal arm 27 on its second end 30 supports a pivot arm 31 at pivot joint 90.

The pivot arm 31 includes a pivoting end 32 at pivot joint 90 and an engaging end 33. The engaging end 33 includes means 34 operable to couple to the cassette 5. The second means 25 further includes a means described with reference to FIG. 7 for controlling the position of the pivot arm 31 as it pivots about a plane orthogonal to the shaft 10.

The coupling means 34 on the coupling end 33 of the pivot arm 31 operates to couple the cassette 5 holding articles to be processed. The coupling means 34 is preferably pivotally mounted on the coupling end 33 of the pivot arm and includes means described below for the rotational orientation of the cassette 5 while coupled to coupling means 34.

In the preferred embodiment, a host elevator means 36 is mounted at the location 26 in alignment with the shaft 10 to receive the cassette 5. The host elevator means 36 includes a support platform 37 which is vertically positionable with a worm gear apparatus 45. Also, a conveyor 38 operates to lift the articles to be processed from the cassette 5 and transport them away from the host elevator means 36.

FIGS. 2-6 illustrate various positions of manipulator 1 of the first embodiment as it transports a cassette 5 from within the container 7, to the elevator host means 36 in alignment with the shaft 10. Parts of the manipulator 1 shown in FIGS. 2-6 are labeled with consistent reference numbers when appropriate.

Figure 2:
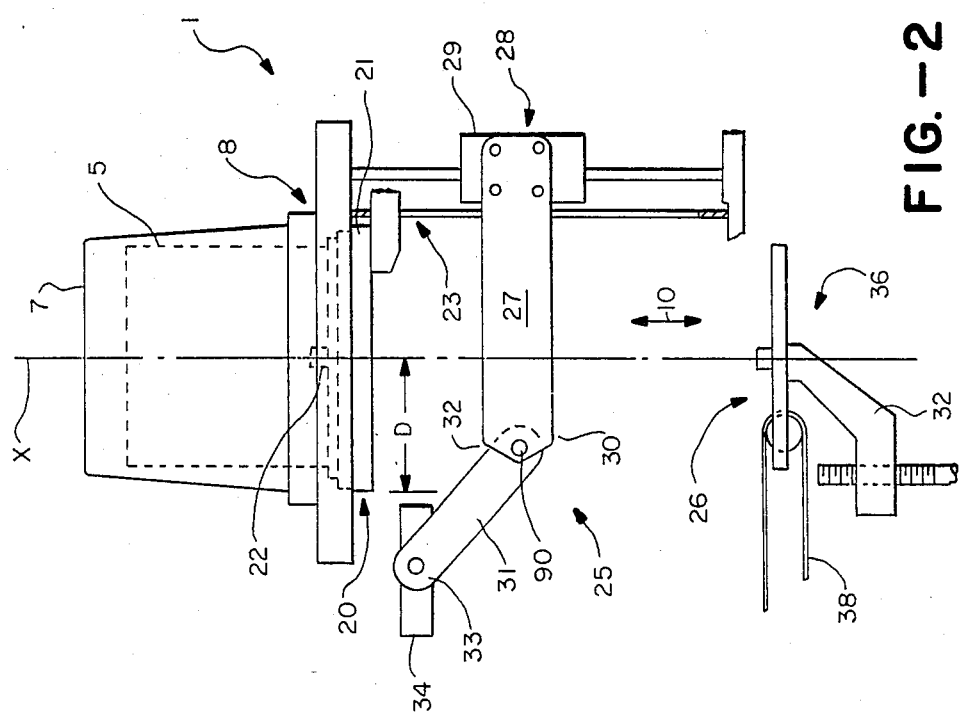
FIG. 2 through FIG. 6 are side view drawings of the manipulator according to the first present embodiment of the invention used in description of the manipulation of a cassette holding articles to be processed from a container into the processing station.
Figure 3:
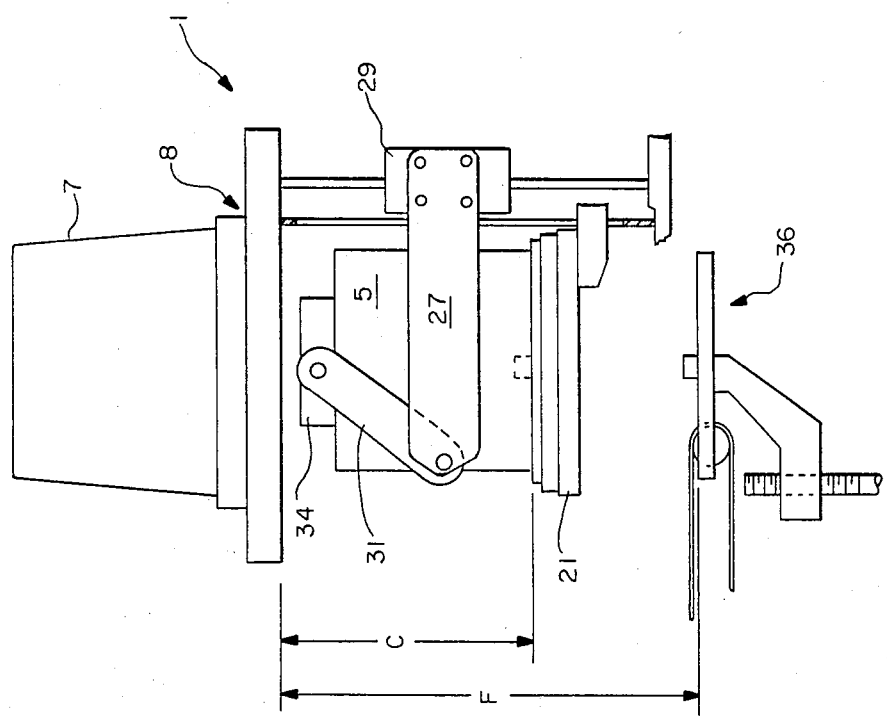

FIG. 2 shows manipulator 1 in a position for removing the cassette 5 from the container 7. The cassette 5 remains inside the container 7 on processing station 2. The first platform 21 of the first means 20 is positioned adjacent to cassette port 8 on the processing station 2. The second means 25 is positioned low in the shaft 10 allowing a large range of freedom of movement in the shaft 10 by the first means 20. When the cassette port 8 releases the cassette 5, the first platform 20 is lowered into the shaft 10 as shown in FIG. 3 with the cassette 5 supported thereon. The pivot arm 31 is swung into position so that the coupling means 34 engages the cassette 5 for lifting the cassette 5 off of the first platform 21.

Figure 4:
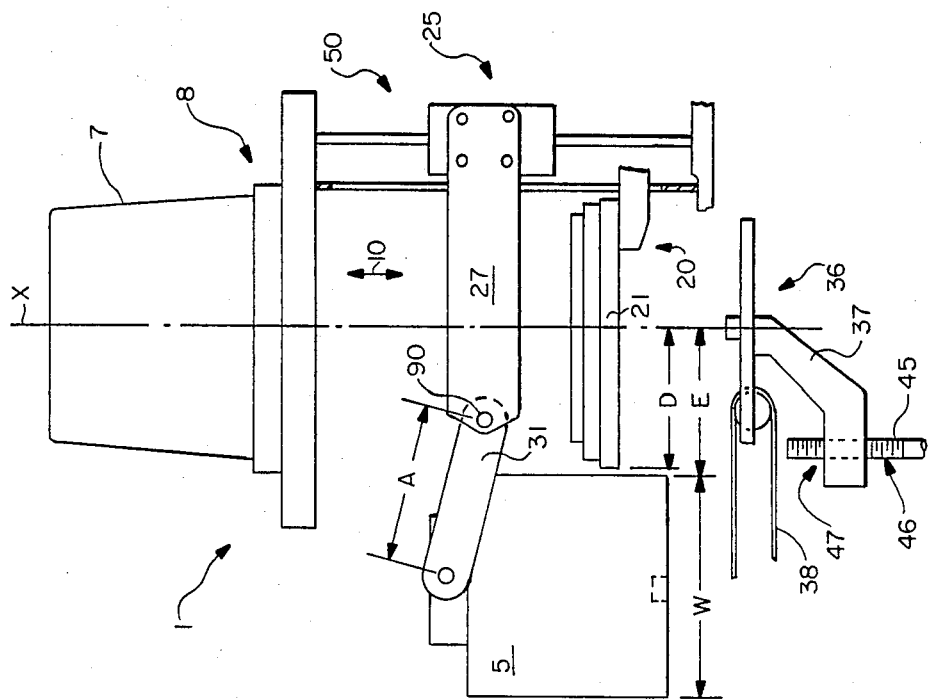

As can be seen in FIG. 4, the pivot arm 31 is then pivoted to swing the cassette 5 to position outside the first platform 21 leaving room for the first platform to be repositioned adjacent to cassette port 8.

Figure 6:
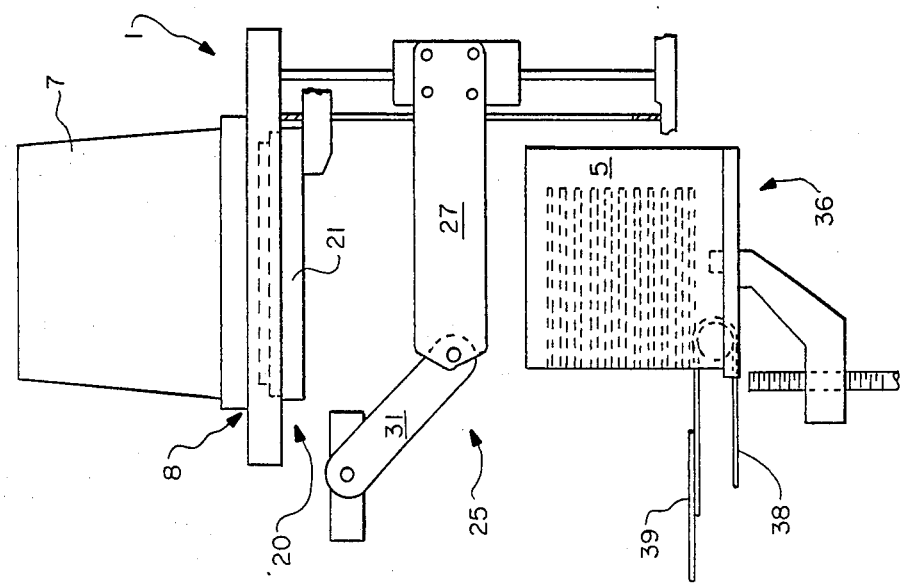
Figure 5:
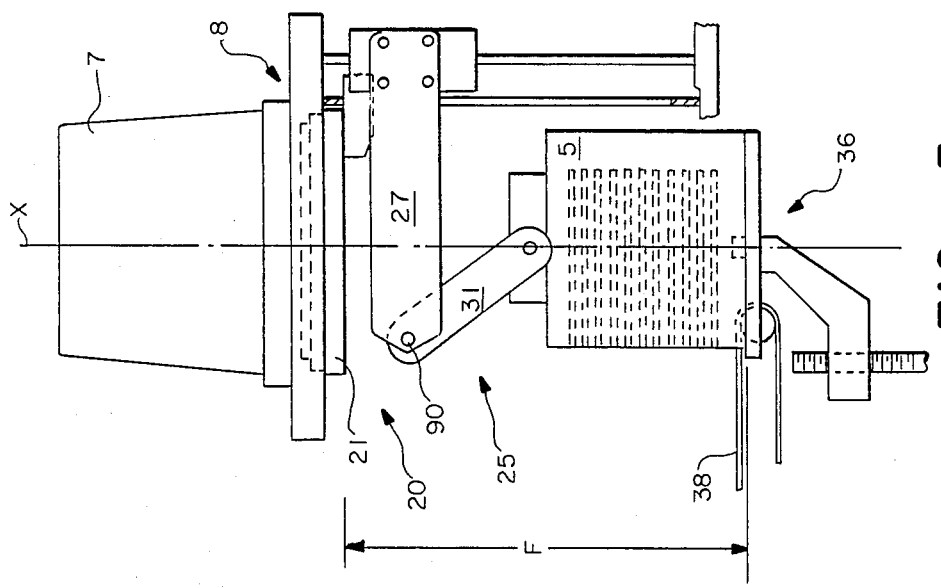

As the first platform 21 rises to engage the cassette port 8, as shown in FIG. 5, the pivot arm 31 then swings the cassette 5 into position on the host elevator means 36. As shown in FIG. 6, the pivot arm 31 and the orthogonal arm 27 can then be positioned away from the cassette 5 holding articles to be processed which is supported on the host elevator means 36. The host elevator means operates to lower the cassette 5 so that articles, such as semiconductor wafers 39 can be removed from the cassette 5 by the conveyor 38. The conveyor then transports the articles into the processing station 2.

The manipulator 1 in the first embodiment of the present invention can be designed to utilize a minimum of space within the processing station 2. For a cassette 5 holding articles to be processed having a dimension of about 5 inches high by 4 inches wide, the entire manipulator 1 can be accomplished with a shaft of about 9 inches long, the pivot arm 31 of about $4\frac{1}{4}$ inches long from the pivot joint 90 to the coupling end 33. An orthogonal arm extending about 2 and $\frac{1}{8}$ inches past the center line of the first platform 21 as indicated by alignment pin 22. The range of pivoting motion of the pivot arm 31 thus is required to be 240 degrees. The cassette 5 will be coupled to when the pivot arm is 30 degrees away from vertical toward the center of the shaft. Likewise the cassette 5 will be aligned in the center of the shaft when the pivot arm is 30 degrees away from vertical below the first platform 21 inside the shaft for alignment onto the host elevator means 36. These dimensions and angles are selected in the preferred embodiment to provide a clear range of motion for manipulating the cassette 5 while minimizing the amount of space necessary within the processing station 2 for the manipulator 1.

The host elevator means 36 includes a worm gear apparatus 45 for positioning the elevator platform 37. The worm gear apparatus 45 includes a threaded bar 46 and a bearing 47 which engages the threaded bar 46. The threaded bar 46 is threaded so that when turned by a motor (not shown) the position of the platform 37 is controlled.

Figure 8:
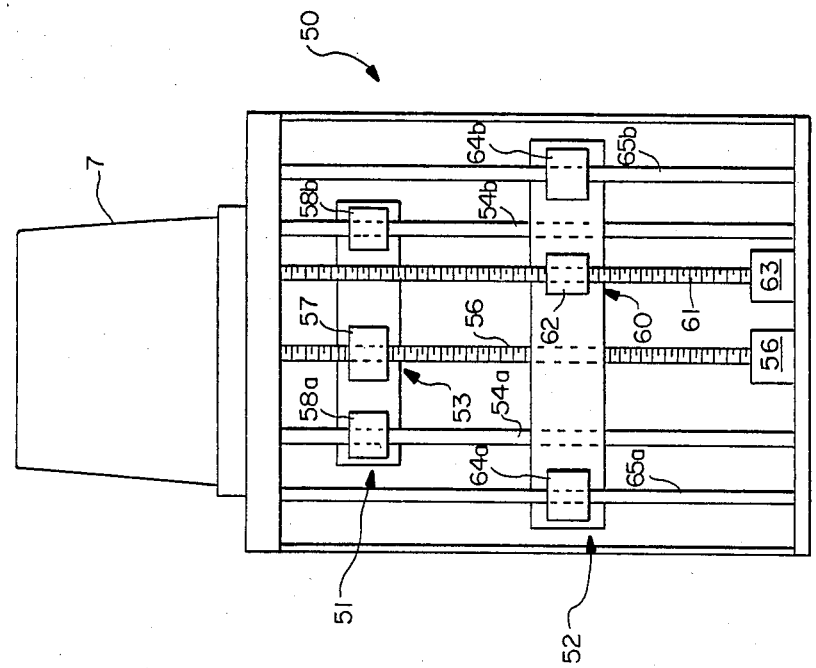
FIG. 8 is a backview of the manipulator according to the first present embodiment of the invention showing a means for transporting the platforms along the shaft.

As can be seen in FIGS. 2-6, the first means 20 and the second means 25 are supported on a guide means 50 for guiding the first means 20 and the second means 25 along the shaft 10. FIG. 8 shows a back view of a guide means 50 on which the first means 20 and second means 25 may be mounted. The guide means 50 includes a means 51 for controlling the position of the first platform 21 and means 52 for controlling the position of the orthogonal arm 27. The means 51 includes a worm gear apparatus 53 for controlling the position and two guides 54a, 54b providing alignment and stabilization for the first platform 21. A motor 55 controllably turns the threaded bar 56. Bearing 57 which mates with the threaded bar 56 thus operates to control the level of the first means 20. Bearings 58a and 58b operate to secure the first means 20 on the guide means 54a, 54b.

The means 52 likewise includes a worm gear apparatus 60 for controlling the position of the orthogonal arm 27 of the second means 25. The worm gear apparatus 60 includes a threaded bar 61 and a bearing 62 which mates the threaded bar 61. A motor 63 turns the threaded bar 61 to control the position of the second means 25. Bearings 64a, 64b operate to stabilize the second means 25 on guides 65a and 65b.

Figure 7:
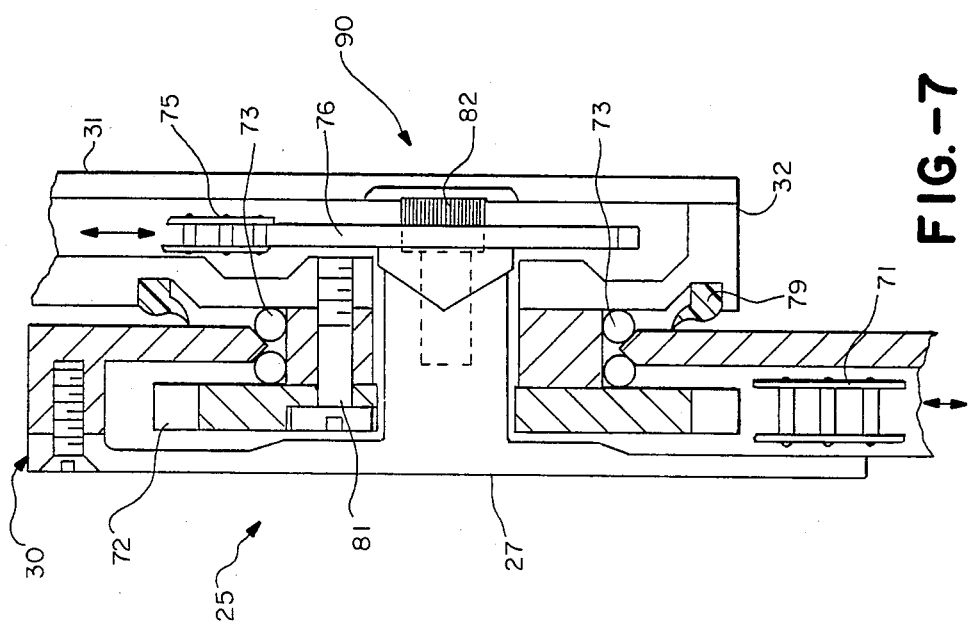
FIG. 7 is a cross-sectional view of the pivot joint for the pivoting arm of the first present embodiment of the invention.

FIG. 7 illustrates the pivot joint 90 at the pivoting end 32 of the pivot arm 31 and at the second end 30 of the orthogonal arm 27. As can be seen in FIG. 7, a miniature drive chain 71 is journalled within the orthogonal arm 27. The miniature drive chain 71 engages a sprocket 72 which is mounted on the pivot arm 31. Pivot arm 31 is supported on bearings 73 so that as the drive chain 71 turns the sprocket 72, the angular position of the pivot arm 31 is controlled. A motor (not shown) at the second end .29 of the orthogonal arm 27 controls the miniature drive chain 71.

Journalled within the pivot arm 31 is another miniature drive chain 75 which engages a sprocket 76 that is mounted on the orthogonal arm 27. As the angular position of the pivot arm 31 changes with respect to the orthogonal arm 27, the miniature drive chain 75 translates the position of the pivot arm 31 to the coupling means 34 on the coupling end 33 of the pivot arm 31. This may be utilized to control the alignment of the coupling means 34 on the pivot arm 31 so that it maintains the cassette 5 upright.

The bearings 73 are sealed by a seal 79 to prevent any contamination in the processing station from the pivot joint 90. The sprocket 72 is supported on the pivot arm 31 by a screw 81. Likewise screw 82 supports the sprocket 76 on the orthogonal arm 27.

The operation of the first embodiment is explained by reference to FIG. 2-6. The orthogonal arm 27 has the pivot 90 located between the central axis X and the outer edge of the platform 21. Platform 21 has its edge offset an amount D from the central axis X as shown in FIGS. 2 and 4. The effective length, A, of the pivot arm 31 is such that when fully extended, the cassette 5 having a width, W is offset by an amount E away from the X axis. The offset E is greater than the protrusion, D, of the platform 21 from the X axis. In this manner, the platform 21 can be translated in either direction in a bypassing manner along the X axis so as to be either above or below the cassette 5.

As shown in FIG. 3, the arm 31 has been rotated to engage the top of the cassette 5 at a position where the platform 21 is offset a dimension C from the bottom of the port plate 8. In FIG. 4, the pivoting arm 31 has been rotated so that the container clears the offset D defining the end of the platform 21 so that the platform 21 bypasses the cassette 5 and operates to be returned as shown in FIG. 5 to close the port opening.

Also in FIG. 5, the arm 31 has been further rotated in the counter-clockwise direction so that the cassette 5 is again centered along the axis X, but this time below the platform 21. The movement of the container 5 as revealed in FIGS. 3, 4, and 5 demonstrates the ability of the present invention first to unload the cassette 5 which is centered on the X axis, second to offset the cassette 5 in a bypassing relation with platform 21 as shown in FIG. 4, and third to return the cassette 5 to the co-axial position as shown in FIG. 5.

The pivot 90 located between the axis X and the D offset from the axis at the end of platform 21 (coupled with the effective length A of the pivot arm 31) provides a mechanism which minimizes the height F required in order to have the co-axial loading and unloading, in a bypassing relationship, with platform 21. The present invention is, therefore, particularly useful in minimizing the amount of height F required in which to co-axially unload a cassette 5 from the container 7. This feature is particularly useful when the present invention is adapted to processing apparatus in a clean room environment where the dimension F needs to be as small as possible.

In summary, the first embodiment discloses a manipulator 1 for removing a cassette 5 holding articles, such as semiconductor wafers, to be processed from a container 7 supported on a processing station 2 in a standard mechanical interface (SMIF) system. The container is supported on an interface cassette port on the canopy of the processing station. The first platform transportable along a shaft below the cassette port is operable to mate with the cassette port and receive the cassette from the container. The first platform is transported down the shaft, thereby removing the cassette from the container. An orthogonal arm mounted along a side of the shaft includes a pivoting arm which swings to couple the cassette on the first platform and support the cassette off of the first platform. The pivot arm then transports the cassette away from an area above the first platform allowing the first platform to move back in bypassing relationship up the shaft to seal the cassette port. The cassette is then positioned, by the pivot arm and the orthogonal arm, on a host elevator located at the bottom of the shaft. The manipulator according to the present invention occupies a small vertical space within a processing station.

FIG. 9 shows a perspective view of the manipulator 101 of a second embodiment of the present invention mounted with a simplified depiction of a processing station 102 with which the manipulator 101 is used. The processing station 102 includes a body 199 in which a processing step is conducted. For instance, when the articles to be processed are semiconductor wafers, the processing station may operate to place a layer of photoresist on the surface of the wafer. Of course, many other processing steps may be accomplished.

The processing station 102 includes a canopy 104 which covers the open parts of the body 199 of the processing station 102. The canopy 4 prevents particulate contamination inside the processing station 102. Manipulator 101 operates to remove a cassette 105 holding articles 106 to be processed from a container 107 through a cassette port 108 and transport the cassette 105 into the processing station 102. The cassette port 108 in preferred embodiment is described in detail in the prior commonly assigned application entitled BOX DOOR ACTUATED RETAINER referred to above and incorporated by reference as if fully set forth herein.

The manipulator 101 comprises a port plate 109 supporting the cassette port 108, and a shaft 110 including a central axis 103 extending from the cassette port 108 into the processing station 102. Alternatively, the cassette port 108 may be incorporated into the canopy 104 of the processing station 102. Preferably, the shaft 110 and central axis 103 extends vertically down from the cassette port 108 so that gravity operates to lower the cassette 105 from the container 107 when the cassette port 108 is open.

Further, the manipulator 101 of the second embodiment includes a first means 111 for supporting the cassette 105 and transporting the cassette 105 along the central axis of shaft 110 through the cassette port 108 to and from the processing station 102. The first means 111 includes a first platform 112 that is supported in the shaft 110. The cassette 105 is supportable on the first platform 112 so that when the cassette port 108 is opened, the cassette 105 rests on the first platform 112. An alignment pin (not shown) may be mounted on the first platform 112 to support the cassette 105 or other means for holding the cassette 105 on the platform 112 may be used. As described in more detail with reference to FIG. 10 through FIG. 14, the first means includes a means for controllably moving the first platform 112 with the cassette supportable thereon through the shaft 110 from adjacent the port 108 to and from any position along the central axis 103 of the shaft 110. Thus the first platform 112 is moveable up the shaft to mate with and seal the cassette port 108. When the cassette port 108 opens, the cassette 105 is supported on the first platform 112. The first platform 112 may then be lowered along the shaft 110 into the processing station 102 with the cassette 105 riding on it.

The manipulator 101 of the second embodiment further includes a second means 113 that is transportable through the shaft 110 for transporting the cassette 105 to and from at least one location 114 away from the shaft 110 inside the processing station 102 and for transporting the cassette 105 to and from the first means 111 when the first means 111 is away form the cassette port 108.

The second means 113 includes a second platform 115 supported in the shaft 110. Further, a mechanical arm 116 is pivotally mounted on the second platform 115. The mechanical arm 116 includes a first end 117 and a second end 118. First end 117 is mounted pivotally on the second platform 115 and operable to pivot about the first end 117 in a plane orthogonal to the shaft 110.

Mounted on the second end 118 of the mechanical arm 116 is a coupling means 119 for coupling to the cassette 105 holding articles 106 to be processed. The coupling means 119 is preferably pivotally mounted on the second end 118 of the mechanical arm 116 and includes a mechanism described below for controlling the tilt of the cassette 105 while coupled to the coupling means 119.

The second means 113 further includes a means for controllably moving the second platform 115 through the shaft 110. Also included is a means 120 for controlling the position of the second end 118 of the mechanical arm 116, such as a stepper motor or belt driven gear box mounted on the second platform 115. The means 120 for controlling the position of the second end 118 of the mechanical arm 116 operates in conjunction with coupling means 119 so that the cassette 105 is supported for transporting along the plane orthogonal to the central axis 103 of shaft 110 to and from the at least one location 114 within the processing station 102 and to and from the first means 111.

Figure 14:
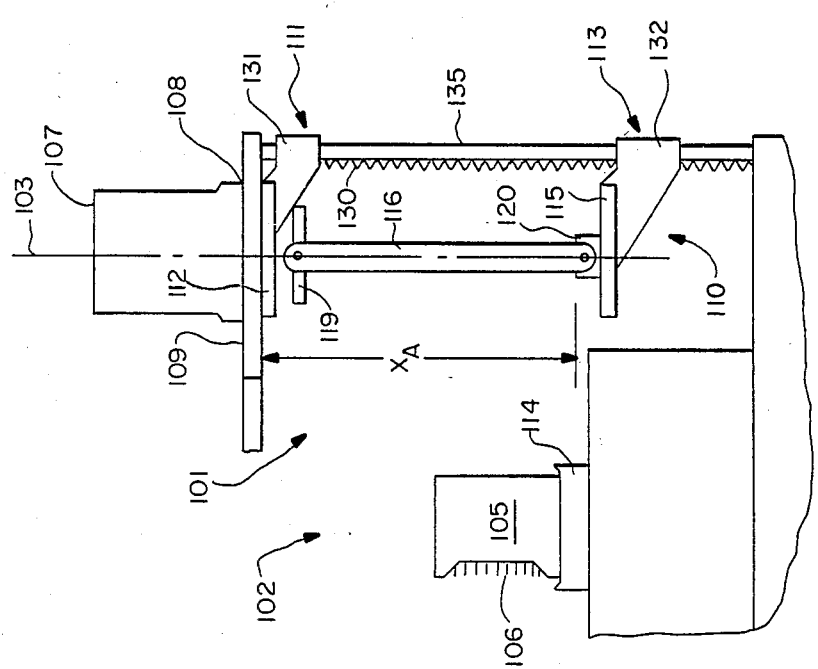
Figure 13:
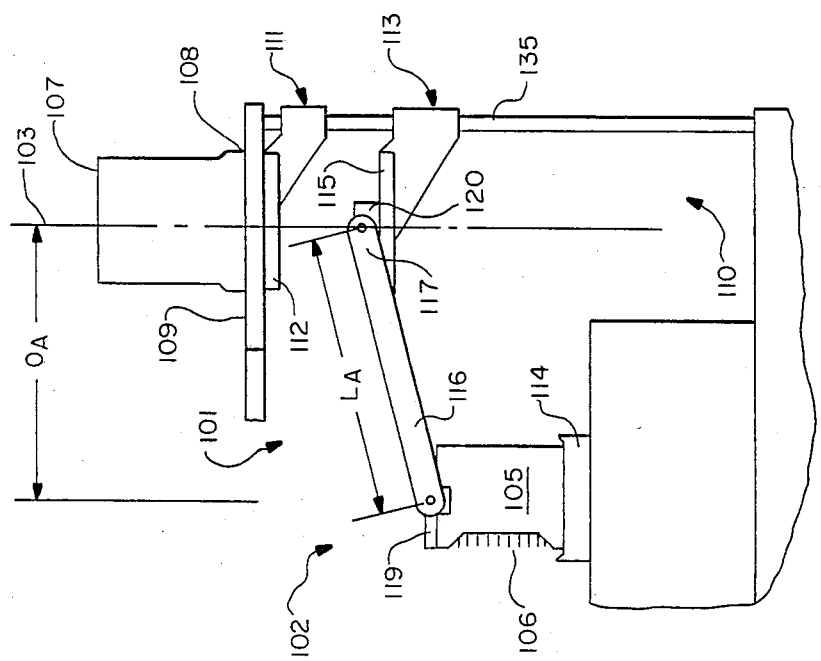

Further details of the preferred embodiment of the manipulator 101 of the second embodiment according to the present invention is described with reference to FIG. 10 through FIG. 14, which show various positions of the manipulator 101 as it transports a cassette 105 from within the container 107 to a location 114 shown in FIG. 13 and 14. The parts of the manipulator 101 shown in FIG. 10 through 14 are labelled with reference numbers consistent with the view shown in FIG. 9 where appropriate.

FIG. 10 shows the manipulator 101 in a position for removing the cassette 105 from the container 107. The cassette 105 remains inside the container 107 on the processing station 102. The first platform 112 of the first means 111 is positioned adjacent the cassette port 108 on the port plate 109. The second means 113 is positioned low in the shaft 110 allowing a large range of freedom of movement in the shaft 110 by the first means 111.

When the cassette port 108 releases the cassette 105, the first platform 112 is lowered into the shaft 110 as shown in FIG. 11. The second platform 115 of the second means 113 is raised slightly and the mechanical arm 116 is positioned using the stepper motor 120 so that the coupling means 119 is aligned over the cassette 105 while it is supported on the first platform 112.

The second means 113 is then lowered allowing the coupling means 119 to couple to the cassette 105. Then it is raised as shown in FIG. 12 lifting the cassette 105 off of the first platform 112 while the mechanical arm 106 pivots and swings the cassette 105 along a plane orthogonal to the central axis 103 of shaft 110 out of the shaft 110. This allows the first means 111 to move along the shaft above the second means 113 so that the container 107 on the cassette port 108 may be closed by the first platform 112 of the first means 111.

As shown in FIG. 13, the first platform 112 is positioned adjacent the cassette port 108 sealing the container 107. The second platform 116 supporting the stepper motor 120 and the first end 117 of the mechanical arm is positioned along the shaft 110 as the mechanical arm 106 swings along the plane orthogonal to the shaft 110 to position the cassette at a location 114 inside the processing station 102. The position 114 is, at a maximum, offset from central axis 103 by a displacement, $O_A$, which is equal to the arm length, $L_A$.

As sown in FIG. 14, the second means 113 operates to lower the second platform 115 into the shaft 110 while the mechanical arm 116 is swung in alignment with the central axis 103 of shaft 110 below the first platform 112. In this manner, the mechanical arm 106 is positioned compactly in the shaft 110 with a clearance distance, $X_A$, which permits the coaxial loading and unloading of cassette 105 into and out from container 107 (see also FIG. 11). Cassette 105 moves and avoids interference with any manipulation that may occur in the processing station 102.

As can be seen, the manipulator 101 is operable to transport the cassette 105 to and from the first platform 112 of the first means 111 and while the cassette 105 is on the first platform 112, the manipulator 101 is operable to transport the cassette 105 to and from the container 107 mounted on a cassette port 108. These functions are accomplished in a minimum amount of space inside the processing station 102.

FIG. 14 schematically shows a particle shield 130 which is mounted along the shaft 110 isolating the mechanics in the means for transporting the first platform 112 and the second platform 115 along the shaft. The isolating shield 130 may be manufactured of an accordion-like folding plastic, such as MYLAR or other material, so that as the first means 111 and the second means 113 are transported along the shaft 110, the isolating shield 130 remains intact. Of course, other means for isolating the mechanics of the means for moving the first platform 112 and the second platform 115 may be utilized as suits the user.

The control signals operating the mechanical arm 116, the coupling means 119, the cassette port 108 and means for holding the cassette 105 on the first platform 112 are all transmitted through or along the support 131 in the first means 111 and the support 132 in the second means 113 to a control, such as a computer or other signal processing device (not shown).

As can be seen in FIGS. 10 through 14, the first means 111 and the second means 113 are supported on a guide means 135 mounted in the shaft 110. FIG. 15 shows a back view of the guide means 135 on which the first means 111 and the second means 113 are mounted.

The guide means 135 includes a means 136 for controlling the position of the second platform 115 in the shaft 110 and a means 137 for controlling the position of the first platform 112 in the shaft 110. The means 136 comprises a worm gear apparatus 151 made up of a threaded bar 140 and a motor 141 for controllably rotating the threaded bar 140. Also, a means for supporting the second means 113, such as bearings 143, 144, on a first guide 138 and a second guide 139 are included. The second means 113 also includes ⓡs a gear bearing 145 which mates with the threaded shaft 140 so that as the threaded shaft 140 is rotated by the motor 141, the position of the second means 113 in the shaft is controlled.

The means 137 for controlling the position of the first platform 112 in the shaft 110 is of a similar construction as the means 136. Thus, a bearing 148 and a bearing 149 are mounted with the first means 111 for supporting the first means 111 in alignment with the first guide 138 and the second guide 139, respectively. A gear bearing 150 is mounted on the first means 111 which mates with the threaded shaft 151 of the worm gear apparatus 152 which operates to control the moving of the first means 111 along the shaft 110. The threaded shaft 151 is rotated controllably by a motor 153 for controllably positioning the first means 111.

The bearings 148 and 149 for maintaining alignment of the first means 111 and the bearings 133 and 134 for maintaining alignment of the second means 113 must provide stable positioning of the first means 111 and the second means 113. Thus, the bearings may be altered to provide a three point support system (not shown) or the guides 138 and 139 and the bearings mating with the guides 138 and 139 should otherwise provide lateral support.

FIG. 16 shows the side view of the manipulator 101 according to an alternate embodiment of the present invention. In particular, the means 120 for controlling the position of the second end 118 of the manipulator arm 116 further includes a carriage and rail assembly 190 on the second platform 115. The pivot point 191 on the first end of the manipulator arm 116 is mounted on the stepper motor or gear box as described above. The stepper motor or gear box is in turn mounted on a carriage 119 on the second platform 115. The second platform 115 includes a rail 193 which guides the carriage 119 along an axis defining a direction 193 orthogonal to the shaft 110. The carriage and rail assembly 190 provides means for positioning the pivoting point 191 of the manipulator arm 116 to provide further flexibility in positioning a cassette mounted on the engaging means 119 within the processing station 102. The carriage position is controlled by a motor or belt driven apparatus (not shown) such as are well known in the art.

In summary, disclosed is a manipulator for removing a cassette holding articles, such as semiconductor wafers, to be processed from a container into a processing station in a standard mechanical interface (SMIF) system. The container is supported on a cassette port on the manipulator of the processing station. A first platform is transportable along a shaft below the cassette port and is operable to mate with the cassette port and receive the cassette from the container. The first platform is transported down the shaft, thereby removing the cassette from the container. A second platform mounted in the shaft includes a manipulator arm which swings to engage the cassette on the first platform and support the cassette off of the first platform. The manipulator arm then pivots to transport the cassette to a location in the processing station away from the shaft. The first platform is then transported back up the shaft to the cassette port to seal the container to prevent particulate contamination. The manipulator arm and the second platform after placing the cassette at a location in the processing station away from the shaft, are then positionable completely inside the shaft to minimize the space taken up in the processing station by the manipulator.

Figure 18:
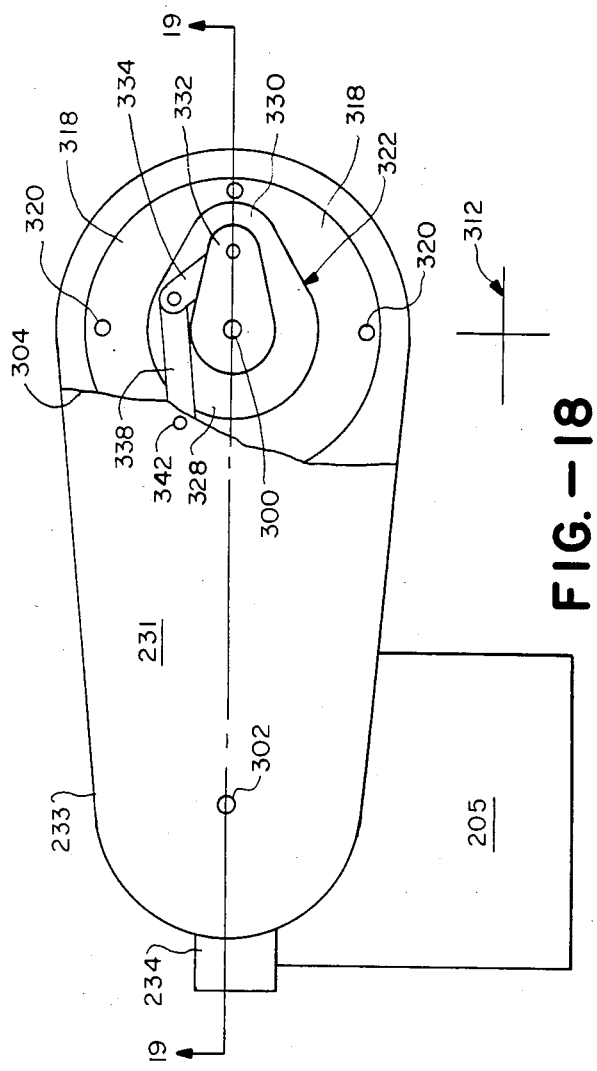
FIG. 18 is a second partially fragmented elevation view of the pivot arm of FIG. 17 illustrating details of a cam profile and cam linkages mounted in front of the first sprocket wheel.
Figure 19:
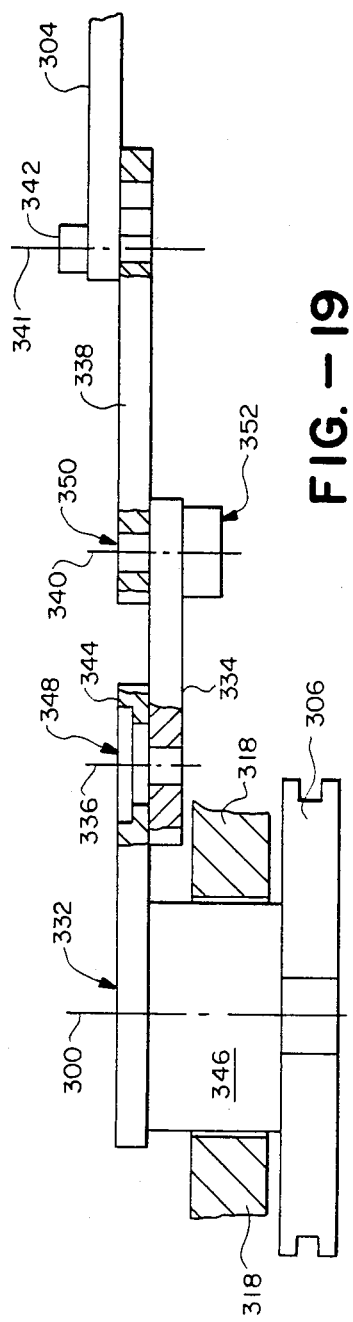
FIG. 19 is a partially fragmented sectional bottom elevation view generally along line 19—19 in FIG. 18 illustrating details of the cam linkages.

FIGS. 17, 18 and 19 illustrate details of mechanisms suitable for being incorporated in the first embodiment of the invention discussed above with respect to FIGS. 1-8. The mechanisms are used for tilting a cassette 205 as a pivot arm 231 rotates about a pivot axis 300. More specifically, referring to the illustrative drawings of FIG. 17 there is shown a partially fragmented view of a pivot arm 231, an orthogonal arm 227 and a coupling means 234 coupled to a cassette 205. The pivot arm 231 includes a pivoting end 232 and a coupling end 233. The pivoting end 232 is rotatably secured to the orthogonal arm 227 such that the pivot arm 231 can rotate about a pivot axis 300 extending through the pivoting end 232 and orthogonal to the orthogonal arm 227. The coupling means 234 is coupled to the pivoting arm 231 adjacent to the coupling end 233 such that the coupling means 234 and the cassette 205 coupled thereto can pivot about a tilt axis 302 which extends through the coupling end 233 and is substantially parallel to the pivot axis 300.

Mounted on the pivot arm 231 within a pivot arm cover 304 are respective first and second sprocket wheels 306 and 308. The respective first and second sprocket wheels 306 and 308 are coupled together by sprocket chain 310 so as to rotate in unison. The first sprocket wheel 306 is rotatably mounted to rotate about the pivot axis 300, and the second sprocket wheel 308 is rotatably mounted to rotate about the tilt axis 302. Furthermore, the second sprocket wheel 308 is secured to the coupling means 234 such that the second sprocket wheel 308 and the coupling means 234 rotate in unison about the tilt axis 302.

Moreover, the first sprocket wheel 306 is rotatably mounted to the pivot arm 231 adjacent to the second end 232 such that when the pivot arm 231 rotates about the pivot axis 300, the first sprocket 306 can also rotate, relative to the pivot arm 231, about the pivot axis 300. The relative rotation of the first sprocket 306 is translated by the sprocket chain 310 to the second sprocket 308 and, therefore, to the coupling means 234 and to the cassette 205 coupled thereto.

The relative rotation of the first sprocket wheel 306 and the pivot arm 231 results in a tilting of the coupling means 234 and of the cassette 205 coupled thereto with respect to an external ground plane 312. The phantom lines 234' illustrate the tilting of the coupling means 234 (and, by implication, of the cassette 205 coupled thereto) as the pivot arm 231 moves through successive stages of its rotation about the pivot axis 300. The phantom lines 234' illustrate that the coupling means 234 is tilted during the rotation of the pivot arm 231 such that during a portion of that rotation, a first side 324 (labelled 324' in the phantom line drawings) is elevated higher with respect to the ground plane 312 than an oppositely disposed second side labelled 326' in the phantom drawings.

As shown in the illustrative drawings of FIG. 22, the tilting of the coupling means 234 and of the cassette 205 attached thereto advantageously causes semiconductor wafers 250 resting upon shelves 252 within the cassette 205 to slide, due to gravitational forces, back into proper seating position on the shelves 252 within the cassette 205. More particularly, FIG. 22 illustrates the cassette 205 and the coupling means 234 in different tilting stages relative to the ground plane 312 as the pivoting arm 231, shown in FIGS. 17 and 18, rotates about the pivot axis 300 and the cassette 205 and the coupling means rotate relative to the tilt axis 302. From the illustrative drawings of FIG. 22, it will be understood that wafers 250 extending beyond the edges of the shelves 252 supporting them are caused to slide into position by the tilting of the cassette 205 and the coupling means 234. Thus, the tilting results in proper seating of semiconductor wafers 250 on shelves 252 within the cassette 205.

Referring to the illustrative drawings of FIG. 18 there is shown a partially fragmented view illustrating further details of the interior of the pivot arm 231. The pivot arm cover 304 is partially broken away so as to reveal a circular plate 318 secured to the pivot arm 231 by bolts 320. The plate 318 is secured adjacent to the pivoting end 232 of the pivot arm 231 such that the plate 318 rotates about the pivot axis 300 in unison with the pivot arm 231.

The plate 318 has an oblong cam profile 322 cut therein. The ca profile 322 includes a substantially circular portion 328 and an oblong portion 330. The cam profile 322 comprises a continuous closed groove defining a path including the substantially circular portion 328 and the oblong portion 330. Since the plate 318 is secured to the arm 231 so as to rotate about the pivot axis 300 with the arm 231, the cam profile 322 also rotates in unison with the pivot arm 321 about the pivot axis 300.

As will be explained more fully below, the first sprocket wheel 306 is rotatably secured behind the plate 318 such that the first sprocket wheel 306 can rotate relative to the cam profile 322 cut into the plate 318. A first oblong cam linkage 332 is secured to the first sprocket wheel 306 so as to rotate in unison with the first sprocket wheel 306. A second cam linkage 334 is pivotally secured to the first oblong cam linkage 332 such that the second cam linkage 334 can pivot about a first cam pivot axis 336. The second cam linkage 334 is pivotally secured to one end of a third cam linkage 338 such that the second cam linkage 334 can rotate relative to the third cam linkage 338 about a second cam pivot axis 340. The respective first and second cam pivot axes 336 and 340 extend parallel to the respective pivot and tilt axes 300 and 302. The third cam linkage 338 is rotatably secured at another end to the pivot arm cover 304 by journal 342.

Referring now to the illustrative drawings of FIG. 19 there is shown a partially fragmented view illustrating details of the cam linkages 332, 334 and 338 and of the first sprocket wheel 306. The first oblong cam linkage 332 includes an arm portion 344 and a bearing portion 346 having a circular cross section. The bearing portion 346 is rotatably mounted in the plate 318, which is partially shown in fragmented cross section, such that the first oblong cam linkage 332 can rotate independently of the plate 318. The bearing portion 346 is fixedly secured to the first sprocket wheel 306 such that the first oblong cam linkage 332 rotates in unison with the first sprocket wheel 306 about the pivot axis 300.

Moreover, the first cam linkage 332 is rotatably secured by a journal 348 to the second cam linkage 334 such that the respective first oblong cam linkage 332 and the second cam linkage 334 can rotate about the first cam pivot axis 336. The second cam linkage 334, in turn, is rotatably secured to the third cam linkage 338 by a journal 350 such that the respective second and third cam linkages 334 and 338 can rotate about the second cam pivot axis 340. Finally, the third cam linkage 338 is secured by journal 342 to the pivot arm cover 304 such that the third cam linkage 338 can rotate about a third cam pivot axis 341.

A lidable bearing member 352 depends from the second cam linkage 334 adjacent to a region where the respective second and third cam linkages 334 and 338 are rotatably secured to one another. Referring now to both FIGS. 18 and 19, it will be appreciated that the bearing member 352 rides within the cam profile 322. Due to the oblong shape of the cam profile 322, and due to the fact that the third cam linkage 338 is rotatably secured to the pivot arm cover 304, the first cam linkage 332 causes the coupling means 234 and the cassette 205 coupled thereto to maintain a substantially constant orientation relative to the ground plane 312 when the bearing member 352 is riding within the substantially circular portion 328 of the cam profile 322. When bearing member 352 is riding within the oblong portion 330 of the cam profile 322, however, the coupling means 234 and the cassette 205 coupled thereto are caused to tilt relative to the ground plane 312.

Thus, it will be appreciated that the use of the respective first and second sprocket wheels 306 and 308 in conjunction with the sprocket chain 310 and the cam profile 322 with the respective first, second and third cam linkages 332, 334 and 338 connected as described above advantageously can be used to cause the coupling means 234 and the cassette 205 coupled thereto to tilt as illustrated by phantom lines 234' shown in FIG. 17. The tilt of the coupling means 234 and of the cassette 205 advantageously causes semiconductor wafers 250, as shown in FIG. 22, resting upon shelves 252 within the cassette 205 to be properly seated upon the shelves within the cassette 205. Moreover, it will be appreciated that the amount of tilt of the coupling means 234 and of the cassette 205, and the portion the rotational arc defined by the pivot arm 231 during which the tilt occurs can be modified by modifying the shape or orientation, relative to the pivot arm 231, of the cam profile 322.

Referring to the illustrative drawings FIG. 20, there are shown details of an alternative cam profile 322' suitable for being incorporated in the pivot arm discussed above with respect to FIGS. 17–19. More particularly, the drawings show details of a circular plate 318' suited for being fixedly secured to a pivot arm (not shown) identical to the pivot arm 231 described above with regard to FIGS. 17, 18 and 19. Like the plate 318 described with respect to the above three figures, the plate 318' includes bolts 320' for securing the plate 318' to a pivot arm. A cam profile 322' is cut in the plate 318'. The cam profile 322' includes a substantially circular portion 328' and an oblong portion 330'.

In addition, the cam profile includes a discontinuity portion 354. The discontinuity portion 354 will cause a bearing member (not shown) like the bearing member 352 shown in FIG. 19 to rapidly change its direction of movement while riding within the cam profile 322' as the bearing member moves through the discontinuity portion 354. This rapid change in direction is translated into a rapid change in tilt orientation of the coupling means 234 and of the cassette 205 coupled thereto which are shown in FIGS. 17 and 18. This rapid change in tilt orientation, in turn, advantageously jolts or shakes wafers resting upon shelves within the cassette 205 so that the wafers overcome static frictional forces and slide into proper seating position within the cassette 205.

Referring to the illustrative drawings of FIG. 21 there are shown details of mechanisms suitable for incorporation in the second embodiment of the invention described above with respect to FIGS. 9–16. The mechanisms are used for tilting a cassette 405 as a mechanical arm 416 rotates about a pivot axis 500 extending in a direction perpendicular to the length of the mechanical arm 416 and through a first end 417 of the mechanical arm 416. More specifically, the first end 417 is mounted pivotally on a second platform 415 such that the mechanical arm 416 is pivotable about the pivot axis 500 in a plane substantially orthogonal to a vertical guide means 435 on which the second platform 415 and the mechanical arm 416 mounted thereon can move. A coupling means 419 is rotatably secured to the mechanical arm 416 adjacent to a second end 418 of the arm 416. The coupling means is adapted for being coupled to the cassette 405 such that the coupling means 419 and the cassette 405 move in unison.

In the drawings of FIG. 21, the mechanical arm 416 is shown with an external arm cover removed so as to reveal respective first and second sprocket wheels 506 and 508 and a sprocket chain 510 coupling the respective wheels to one another. The first sprocket wheel 506 is rotatably secured on the second platform 415 so as to move vertically with the second platform 415 and so as to rotate about the pivot axis 500 relative to the mechanical arm 416. The second sprocket arm 508 is rotatably secured to the mechanical arm 416 adjacent to its second end 418 such that it can rotate about a tilt axis 502 relative to the mechanical arm 416. The tilt axis 502 extends through the mechanical arm 416 adjacent to its second end 418 and substantially parallel to the pivot axis 500. Moreover, the coupling means 419 is fixedly secured to the second sprocket wheel 508 such that the coupling means 419 and the cassette 405 coupled thereto rotate in unison with the second sprocket wheel 508.

A tilt control means 516 is mounted to the second platform 415. The tilt control means 516 imparts to the first sprocket wheel 506 rotational motion relative to the first end 417 of the mechanical arm 416. The relative rotational motion of the first sprocket wheel 506 is translated to the second sprocket wheel 508 by the sprocket chain 510 such that the respective first and second sprocket wheels 506 and 508 rotate in unison. Since the coupling means 419 and the cassette 405 rotate about the tilt axis 502 in unison with the second sprocket wheel 508, rotation of the first sprocket wheel 506 is translated to rotation of the coupling means 419 and the cassette 405 as well.

The tilt control means 516, for example, may comprise a microprocessor-controlled motor (not shown) which can be programmed to cause the first sprocket arm 506 to rotate relative to the first end of the mechanical arm 416 by a prescribed amount which can be dependent upon the rotational orientation of the mechanical arm 416 relative to the pivot axis 500. For example, the arc labelled 518 represents the rotational motion of the second end 418 of the mechanical arm 416 as it rotates about the pivot axis 500. Moreover, the phantom lines labelled 419' illustrate the tilt of the coupling means (and, by implication, of the cassette 405 coupled thereto) relative to a ground plane 512 at different stages in the arc of rotation of the mechanical arm 416. At different stages of the rotational arc, a first side 524 of the coupling means (labelled 524' in the phantom line drawings) is elevated above an oppositely disposed second side (labelled 526' in the phantom line drawings).

It will be appreciated that the tilting of the coupling means 419 and of the cassette 405 attached thereto during rotation of the mechanical arm 416 advantageously causes semiconductor wafers (not shown) resting upon shelves (not shown) within the cassette 405 to slide into proper seating position within the set 405 during the tilting. Consequently, the inclusion of the tilting mechanism described herein advantageously can be used to properly seat semiconductor wafers within the cassette without the need to physically contact the wafers.

The tilt control means 516 can be adjusted to vary the degree of tilt of the coupling means 419 and of the cassette 405 coupled thereto and to vary the stage of rotation of the mechanical arm 416 in which the tilt occurs. This can be achieved in a manner which will be understood by those skilled in the art by appropriately programming the microprocessor-controlled motor (not shown). Furthermore, the speed at which the tilt of the coupling means and of the cassette 405 coupled thereto changes its degree of tilt relative to the ground plane 512 can be varied so as to impart a sudden movement to semiconductor wafers (not shown) within the cassette 405 to cause the wafers to overcome static frictional forces and to move into proper seating position within the cassette 405. The principles illustrated in FIG. 22 by which wafers resting upon shelves within the cassette are caused to slide into proper position within the cassette by the tilting of the cassette apply here as well.

The foregoing description of preferred embodiments of the invention has been presented for the purposes of illustration and description. It is not intended to be exhaustive or to limit the invention to the precise form disclosed, and obviously many modifications and variations are possible in light of the above teachings. Thus, further aspects of the invention can be determined by a study of the specification, the drawings and the claims. It is intended that the scope of the invention be defined by the claims appended hereto.

While the invention has been particularly shown and described with reference to preferred embodiments thereof, it will be understood by those skilled in the art that the foregoing and other changes in form and detail may be made therein without departing from the spirit and scope of the invention.

We claim:

1. Apparatus for transferring a cassette holding articles to be processed to and from a container supported at a processing station where the processing station has a cassette port for receiving the cassette when the cassette moves along a central axis extending from outside the processing station through the cassette port, and into the processing station, said apparatus comprising:
   platform means including a cassette platform transportable substantially along said central axis for transferring the cassette to and from the container substantially along said central axis;
   manipulator means including a first member extending substantially orthogonal to said central axis, the first member including a first portion and a second portion;
   a pivoting arm including a pivoting portion and a coupling portion, the pivoting portion mounted pivotally adjacent to the second portion of the first member, the pivoting arm operable to pivot about a pivot axis extending substantially through the pivoting portion and substantially perpendicular to the central axis;
   coupling means mounted adjacent to the coupling portion of the pivoting arm for coupling to the cassette; and
   tilt means for tilting the coupling means and the cassette coupled thereto during pivoting by said pivoting arm, such that during the pivoting the cassette tilts relative to the central axis.

2. The apparatus of claim 1 wherein:
   said platform means includes means for controlling the position of said cassette platform with the cassette supportable thereon substantially along the central axis;
   said manipulator means includes means for controlling the position of said first member substantially along the central axis; and
   means for controlling the position of the coupling portion so that said coupling means supports the cassette during transporting substantially about the pivot axis.

3. The apparatus of claim 2, wherein said cassette platform travels a first length substantially along the central axis and said pivoting arm has a second length shorter than said first length so that said pivoting arm may be positioned parallel to said central axis.

4. The apparatus of claim 2, further including:
   means for preventing particulate contamination from travelling into the processing station from said means for controlling the position of said cassette platform and said means for controlling the position of said first member.

5. The apparatus of claim 2, wherein
   said cassette platform includes means for sealing the cassette port when the cassette platform is positioned adjacent the cassette port.

6. The apparatus of claim 2, wherein:
   said means for controlling the position of said cassette platform includes a first worm gear apparatus; and
   said means for controlling the position of said first member includes a second worm gear apparatus.

7. The apparatus of claim 2, wherein;
   said means for controlling the position of said coupling portion further includes means for controlling the position of said pivoting portion mounted adjacent to the second portion of said first member along an axis substantially orthogonal to said central axis.

8. The apparatus of claim 1 wherein said tilt means, during at least a portion of the pivoting by said pivoting arm, rapidly changes a rate of change of tilt of said coupling means and of the cassette coupled thereto.

9. In a standard mechanical interface system an apparatus for transferring a cassette holding articles to be processed, the articles being supported upon shelves within the cassette, to and from a container supported at a processing station where the processing station has a cassette port for receiving the cassette when the cassette moves along a central axis extending from outside the processing station through the cassette port, and into the processing station, said apparatus comprising:
   a cassette platform for supporting the cassette, transportable substantially along said central axis and adapted to seal the cassette port when positioned adjacent the cassette port;
   cassette transport means for controlling the position of said cassette platform substantially along said central axis;
   an arm platform transportable along said central axis;
   a mechanical arm, extending an arm length between a first portion and a second portion, said first portion mounted pivotally on said arm platform and operable to pivot in a plane substantially parallel to said central axis whereby said second portion is pivotal between said central axis and said arm length from said central axis;
   coupling means mounted to said second portion of said mechanical arm for engaging the cassette;
   arm transport means for controlling the position of said arm platform along the central axis;
   means for controlling the position of said second portion so that said coupling means supports the cassette for transporting the cassette along the plane substantially parallel to the central axis to and from said at least one location within the processing station and to and from said cassette platform; and
   tilt means for tilting the coupling means and the cassette coupled thereto during pivoting by said mechanical arm, such that during the pivoting the cassette tilts relative to the central axis;

whereby the articles supported upon the shelves are caused to move into seating position within the cassette during tilting.

10. The apparatus of claim 9, where said cassette platform travels a first length along said central axis and said mechanical arm has a second length shorter than said first length so that said mechanical arm may be positioned with said second portion along said central axis.

11. The apparatus of claim 9, further including:
means for preventing particulate contamination from traveling into the processing station from said means for controlling the position of said cassette platform and said means for controlling the position of said arm platform.

12. The apparatus of claim 9, wherein:
said articles to be processed include semiconductor material.

13. The apparatus of claim 9, wherein;
said means for controlling the position of said cassette platform includes a first worm gear apparatus; and
said means for controlling the position of said arm platform includes a second worm gear apparatus.

14. The apparatus of claim 9, wherein,
said means for controlling the position further includes means for controlling the position of said first portion on said arm platform along an axis substantially parallel to said central axis.

15. The apparatus of claim 9 wherein said tilt means further comprising:
first and second rotatable wheels; and
belt means for coupling said first and second wheels such that said first and second wheels rotate substantially in unison.

16. Apparatus for transferring a cassette holding articles to be processed to and from a container supported at a processing station where the processing station has a cassette port for receiving the cassette when the cassette moves along a central axis extending from outside the processing station through the cassette port, and into the processing station, said apparatus comprising:
platform means including a cassette platform transportable substantially along said central axis for transferring the cassette to and from the container substantially along said central axis;
manipulator means including a first member extending substantially orthogonal to said central axis, the first member including a first portion and a second portion;
a pivoting arm including a pivoting portion and a coupling portion, the pivoting portion mounted pivotally adjacent to the second portion of the first member, the pivoting arm operable to pivot about a pivot axis extending substantially through the pivoting portion and substantially perpendicular to the central axis;
coupling means mounted on the coupling portion of the pivoting arm for coupling to the cassette;
means, mounted adjacent to the first portion of the first member, for controlling the axial position of the first member relative to the central axis;
means for controlling the axial position of the cassette platform relative the central axis;
means for controlling the rotational position of the pivoting arm; and
tilt means for tilting the coupling means and the cassette coupled thereto during pivoting by said pivoting arm, such that during the pivoting the cassette tilts relative to the central axis.

17. The apparatus of claim 16 wherein said tilt means further comprises:
first and second rotatable wheels; and
belt means for coupling said first and second wheels such that said first and second wheels rotate substantially in unison.

18. The apparatus of claim 16 and further including an oblong cam member which rotates substantially in unison with said pivot arm and which is coupled to said first wheel.

19. The apparatus of claim 18 and further comprising at least one cam linkage means for coupling said oblong cam member to said first wheel.

20. The apparatus of claim 16 wherein said platform means further includes host elevator means attached to the cassette platform for positioning the cassette platform and the cassette along the central axis.

21. The apparatus of claim 16, wherein said articles to be processed include semiconductor wafers.

22. The apparatus of claim 16, wherein
said cassette platform is adapted to seal the cassette port when positioned adjacent the cassette port.

23. The apparatus of claim 16, wherein:
said means for controlling the axial position of the first member includes a first worm gear apparatus; and
said means for controlling the axial position of the cassette platform includes a second worm gear apparatus.

24. The apparatus of claim 16, wherein the pivot axis extends substantially perpendicular to the first member.

25. The apparatus of claim 16, wherein said pivoting arm can rotate about the pivot axis to a first rotational position in which the cassette, when supported by the cassette platform, can substantially bypass said coupling means when the platform is transported substantially along the central axis.

26. The apparatus of claim 25 wherein said pivoting arm can rotate about the pivot axis to a second rotational position in which said coupling means is disposed between the cassette port and the first member and in which said coupling means can couple to the cassette when the cassette is supported by the cassette platform outside the container.

27. The apparatus of claim 26 wherein said pivoting arm can rotate about the pivot axis to a third rotational position in which the first member is disposed between the .cassette port and said coupling means and in which said coupling means can couple to the cassette.

28. The apparatus of claim 27 wherein said means for controlling the axial position of the platform causes the platform to be disposed closer to the cassette port when said pivoting arm is in the third rotational position than when said pivoting arm is in the second rotational position.

29. The apparatus of claim 28 wherein said means for controlling the axial position of the first member causes the first member to be disposed closer to the cassette port when the pivoting arm is in the third rotational position than when the pivoting arm is in the second rotational position.

30. The apparatus of claim 29 wherein the cassette is disposed, substantially coaxially with the cassette port when said pivoting arm is in either the second rotational position or the third rotational position and the coupling means couples to the cassette.

31. The apparatus of claim 30 wherein the pivoting arm can rotate through an arc of between approximately 180° and 270° between the second rotational position and the third rotational position while said coupling means couples to the cassette; and
   wherein the pivoting arm has a length dimension long enough for the cassette to bypass the platform in the course of the pivoting arm rotating through the arc.

32. The apparatus of claim 31 wherein the arc is approximately 240°.

33. The apparatus of claim 16 wherein said tilt means, during at least a portion of the pivoting by said pivoting arm, rapidly changes a rate of change of tilt of said coupling means and of the cassette coupled thereto.

34. In a standard mechanical interface system, an apparatus for transferring a cassette holding articles to be processed, the articles being supported upon shelves within the cassette, to and from a container supported on a processing station, the processing station having a cassette port for receiving the cassette, said apparatus comprising:
   a shaft extending along a first axis from the cassette port on the processing station into the processing station;
   a first platform supported in said shaft having a first side facing the cassette port, the cassette being supportable on said first side of said first platform;
   means for controlling the axial position of said first platform with the cassette supportable thereon relative to said first axis in said shaft;
   a first arm extending substantially orthogonally across said shaft and movable along said shaft, said first arm having a first portion and a second portion;
   means mounted adjacent to said second portion of said first arm, for controlling the axial position of said first arm in said shaft;
   a pivoting arm having a pivoting portion and a coupling portion, said pivoting portion mounted pivotally adjacent to said second portion of said first arm and operable to pivot about a pivot axis extending substantially through the pivoting portion and substantially perpendicular to the first axis;
   coupling means mounted adjacent to said coupling portion of said pivoting arm for coupling to the cassette;
   host elevator means mounted in said shaft for positioning the cassette holding articles to be processed inside the processing station;
   means for controlling the rotational position of said pivoting arm for transporting the cassette to and from said first side of said first platform and to and from said host elevator means; and
   tilt means for tilting the coupling means and the cassette coupled thereto during pivoting by said pivot arm, such that during the pivoting the cassette tilts relative to the central axis; whereby the articles supported upon the shelves are caused to move into seating position within the cassette during tilting.

35. The apparatus of claim 34, wherein said articles to be processed include semiconductor material.

36. The apparatus f claim 34, wherein said first platform is adapted to seal the cassette port when positioned adjacent the cassette port.

37. The apparatus of claim 34, wherein
   said means for controlling the axial position of said first platform includes a first worm gear apparatus;
   said means for controlling the axial position of said first arm includes a second worm gear apparatus.

* * * * *